US011592482B1

(12) United States Patent
Chillarige et al.

(10) Patent No.: US 11,592,482 B1
(45) Date of Patent: Feb. 28, 2023

(54) SCAN CHANNEL SLICING FOR COMPRESSION-MODE TESTING OF SCAN CHAINS

(71) Applicant: Cadence Design Systems, Inc., San Jose, CA (US)

(72) Inventors: Sameer Chakravarthy Chillarige, Bengaluru (IN); Anil Malik, New Delhi (IN); Bharath Nandakumar, New Delhi (IN)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 14 days.

(21) Appl. No.: 17/204,334

(22) Filed: Mar. 17, 2021

(51) Int. Cl.
*G01R 31/3177* (2006.01)
*G01R 31/317* (2006.01)

(52) U.S. Cl.
CPC ... *G01R 31/3177* (2013.01); *G01R 31/31703* (2013.01)

(58) Field of Classification Search
None
See application file for complete search history.

(56) References Cited

U.S. PATENT DOCUMENTS 7,814,444 B2 * 10/2010 Wohl ............... G06F 30/327
716/111
7,925,465 B2 * 4/2011 Lin ............... G01R 31/318575
702/124
8,015,461 B2 * 9/2011 Rajski ............ G01R 31/318547
714/733
2006/0200719 A1 * 9/2006 Keller ............ G01R 31/318547
714/732
2007/0234157 A1 * 10/2007 Rajski ................ G01R 31/2851
714/728

FOREIGN PATENT DOCUMENTS

WO    WO-2021045769 A1 * 3/2021

OTHER PUBLICATIONS

Wang et al)—ITC—"Test Data Compression for IP Embedded Cores"—(2005) (Year: 2005).*
(Dalmasso et al.)—IEEE—"Fitting_ATE_Channels_with_Scan_Chains_"—(2005) (Year: 2005).*
Touba)—"Virtual_Scan_Chains_A_Means_for_Reducing_Scan_Length_in_Cores"—(2000) (Year: 2000).*

* cited by examiner

*Primary Examiner* — Cynthia Britt
*Assistant Examiner* — Matthew W Wahlin
(74) *Attorney, Agent, or Firm* — Tarolli, Sundheim, Covell & Tummino LLP

(57) ABSTRACT

Scan channel slicing methods and systems for testing of scan chains in an integrated circuit (IC) reduce the number of test cycles needed to effectively test all the scan chains in the IC, reducing the time and cost of testing. In scan channel slicing, rather than loading and unloading into scan chains high-power patterns having numerous switching transitions over the length of each scan chain, loading and unloading the entirety of the scan chain scan while observing it, chain load data is sliced, apportioning between the different scan chains independently observable sections (slices) of transition data in which all four bit-to-bit transitions ("0" to "0", "0" to "1", "1" to "0", "1" to "1") are ensured to exist. The remainder of the scan chain load data, which is not observed in the test procedure, can be low-transition data that consumes low dynamic power, such as mostly zeroes or mostly ones.

20 Claims, 14 Drawing Sheets

SCAN PATTERN TEMPLATE (WITHOUT COMPRESSION)

001    scan_procedure begins
002    Scan_Load()
003    Scan_Unload()
004    scan_procedure ends

FIG. 5

COMPRESSION SCAN PATTERN TEMPLATE (WITHOUT DECOMPRESSOR)

001    scan_procedure begins
002    Scan_Load()
003    Load_Channel_Masks()
004    Use_Channel_Masks()
005    Compressed_Output_Stream()
006    scan_procedure ends (002–005 grouped as 602)

FIG. 6

COMPRESSION SCAN PATTERN TEMPLATE (WITH DECOMPRESSOR)

001    scan_procedure begins
002    Compressed_Input_Stream()
003    Load_Channel_Masks()
004    Use_Channel_Masks()
005    Compressed_Output_Stream()
006    scan_procedure ends (002–005 grouped as 702)

FIG. 7

SLICED MASK PATTERN scan_procedure begins

Stim_PI()
Pulse()   // scan      } L (max scan chain length) cycles

Stim_PI()
Pulse()   // mask      } M (# mask bits) cycles

Measure_PO()
Stim_PI()
Pulse()   // scan      } K (slice length) cycles

Stim_PI()
Pulse()   // mask      } 1 cycle / m cycles

⎱ Loop N (measure registers) times scan_procedure ends

FIG. 12

SCAN CHANNEL SLICING FOR COMPRESSION-MODE TESTING OF SCAN CHAINS

TECHNICAL FIELD

This description relates generally to hardware verification of logic circuits, and more particularly to systems and methods for scan channel slicing for compression-mode testing of scan chains.

BACKGROUND

During the process known as "bring-up" for semiconductor devices, automated test equipment (ATE) can be used for post-fabrication testing for integrated circuits (ICs) to quickly determine whether an IC is functioning correctly, without any physical defects. Transition fault testing of an IC containing a large number of logic devices can require the ATE inputting a large number of test patterns into scan chains of the IC. As the chip size and the ratio of logic to be tested per input/output test pin increases, the amount of data needed to be supplied by techniques such as automatic test pattern generation (ATPG) has become voluminous. Design for test (DFT) designers are faced with the challenge of inputting, for each of these large chips, a large volume of scan test sequences via a minimal number of test pins. ATPG increases the required test time and the required amount of tester memory, both of which increase costs associated with DFT.

Test compression reduces test data volume and test application time (TAT) while retaining test coverage by loading highly compressed test data onto the scan chains from low pin-count ATE. An on-board decompressor on the IC decompresses the compressed test data before loading it onto a large number of scan chains on the IC. After applying the scan chain data to the IC, response data is then compressed by an on-board compressor on the IC and is output for measurement and comparison. Test compression recognizes that only a small percentage of scan cells in a scan chain ("care bits") generated by ATPG are necessary for testing. Test compression modifies the testing design to apply the care bits in shorter scan chains. The compression ratio generated by test compression methods is capable of greatly reducing the test data volume and TAT. For example, original data having a volume of 6 Gb and TAT of 20 seconds is, at a 100× compression ratio, reduced by 99% to 60 Mb and TAT of 0.2 seconds.

Test compression can use two structures on the IC, a decompressor and a compressor (or compactor). The decompressor drives the compressed test stimuli onto the IC from the small number of scan-in pins on the ATE to the large number of internal scan channels which feed the logic under test. The decompressor is designed to allow a continuous flow of stimuli so that it is possible to load the scan chain data for a given test onto the IC and to unload from the IC the previous test response data to the compressor, all in a single clock cycle. Compression and decompression logic generally are built using discrete logic gates such as XOR gates, multiplexers, and flip-flops, and are placed inside a logic module called a codec. Wires transfer test stimuli from the decompressor inside the codec to the heads of the scan channels, which may be distributed across the area of the IC. Similarly, wires from the tails of the scan channels transfer the test stimuli to the compressor inside the codec.

SUMMARY

One example includes an ATE device that includes an interface having input and output ports adapted to be communicatively coupled to an IC under test. The IC includes a decompressor configured to decompress compressed inputs from the ATE device, a plurality of scan chains, scan channel selection logic configured to permit observation of outputs from one of the plurality of scan chains at a time by masking outputs of others of the plurality of scan chains, and a compressor configured to compress outputs from the plurality of scan chains. The ATE device further includes a scan channel slicer configured to apportion, among the plurality of scan chains, test patterns for loading into respective ones of the plurality of scan chains, the apportionment such that only an observed one of the plurality of scan chains at a time unloads output data corresponding to its respective test patterns. The ATE device further includes an automatic test pattern generator configured to generate compressed test patterns.

Another example includes a scan channel slicing method for compression-mode testing of scan chains. Initial scan load values are prepared and loaded into a plurality of scan chains in an IC under test. The plurality of scan chains are coupled to a mask register and a compressor. The mask register in the IC is loaded to mask all of the scan chains. Each of the plurality of scan chains is independently observed for faults by, for each of the plurality of scan chains: (1) shifting one bit into the mask register to permit isolated observation of a given one of the scan chains by unmasking only the given one of the scan chains in the mask register; and (2) unloading to the compressor a number of cycles of test data from the given one of the scan chains. The number of cycles is less than the length of the longest of the plurality of scan chains.

Yet another example method includes, for each of a plurality of scan channels in an IC under test, computing a compressed input stream of values that, when decompressed by a decompressor in the IC, includes all four bit-to-bit transitions of "0" to "0", "0" to "1", "1" to "0", and "1" to "1" within a scan channel slice for a given one of the plurality of scan channels, determining a start cycle and an end cycle to the scan channel slice, and storing the start cycle and the end cycle to a scan load table in a row of the scan load table that corresponds to the given one of the plurality of scan chains.

BRIEF DESCRIPTION OF THE DRAWINGS

FIG. 5 is a listing of an example scan pattern template for use in a scan chain test procedure without compression.

FIG. 6 is a listing of an example scan pattern template for use in a scan chain test procedure with compression but without decompression.

FIG. 7 is a listing of an example scan pattern template for use in a scan chain test procedure with compression and with decompression.

FIG. 12 is a listing of an example sliced mask pattern template.

DETAILED DESCRIPTION

Prior to testing of the digital logic of a fabricated IC by feeding test pattern stimuli into scan chains on the IC, the scan chains themselves can be tested to ensure that each of the scan chains works and that subsequent logic tests using the scan chains will produce results that accurately reflect the operational condition of the tested logic, as opposed to reflecting defects in one or more of the scan chains. However, scan chain tests can be time consumptive, and therefore can also be expensive, given that use of automated test equipment is often billed per unit time or, equivalently, per test cycle.

Different test modes may be available to test scan chains in ICs with DFT hardware incorporated. For example, in a simple full-scan test mode, all the scan chains are loaded directly to the output ports, and in a compression mode, the outputs of the N number of scan chains can be compressed using compressor logic comprising, e.g., XOR gates, to bring the N number of outputs down to a much smaller number of outputs. In contrast to full-scan based scan chain test modes, in which a simple lookup of failing locations from scan chain patterns is sufficient to identify failure types, with compression modes, in which scan chain test outputs are compressed prior to output from the IC under test to automated test equipment, failure type identification can be more complex. With compression modes, scan chain mask patterns can be used to observe one channel at a time, requiring the same number of mask sequences as the number of channels. Within each mask sequence, all scan chains are loaded with test values. The mask register is loaded with masking values to enable the observation of only one scan chain at a time while the test values are unloaded. However, compression-mode methods using a mask register may still involve loading and unloading an entire scan chain with a test of each scan chain.

Debug and diagnosis are important aspects of silicon bring-up and yield analysis of complex ICs such as may be used, for example, in artificial intelligence (AI) and automotive applications. Reducing turn-around time for testing each IC increases profitability. Scan channel slicing systems methods, as described herein, offer production scan pattern generation that reduces scan channel load and unload times, among other savings, thereby reducing costs of testing. On an example industrial design, whereas a compression mode approach not using scan channel slicing may require more than 10,000,000 test cycles, an ATPG pattern cycle count can be reduced to fewer than 19,000 test cycles by using scan channel slicing as described herein.

Figure 1:
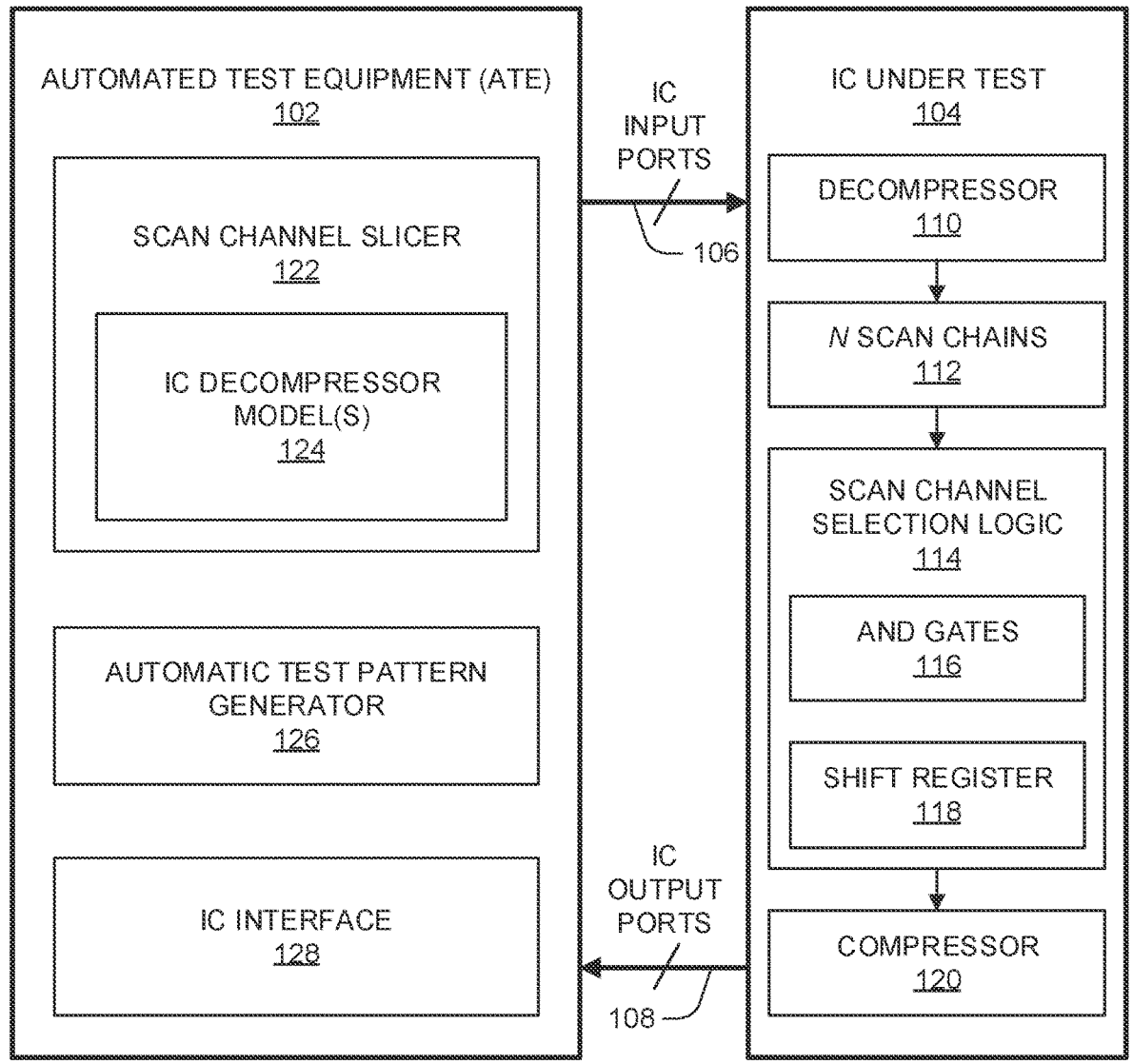
FIG. 1 is a diagram of an example system for reduced cost production scan test automatic test pattern generation for compression modes.

FIG. 1 shows an example scan channel slicing system in which automated test equipment (ATE) 102, also referred to as a tester, is coupled to an IC under test 104 via input ports 106 of the IC and output ports 108 of the IC. As an example, compressed test inputs may be provided through four or eight primary input (PI) pins 106 of the IC 104 and compressed test outputs may be provided through four or eight primary output (PO) pins 108 of the IC 104. A decompressor 110 built into the IC is configured to decompress the compressed test inputs with, for example, an about 100× decompression ratio, to generate, e.g., hundreds of test bits for each several input bits supplied via IC input ports 106. The decompressed test bits are provided as streams of test data to scan chains 112, numbering N, and having a maximum scan chain length of L. In some examples, N can be between about 5,000 and about 10,000, and L can be between about 100 and about 10,000. The scan chains can also be referred to as measure registers. Each scan chain corresponds to a channel that can be sliced in accordance with methods described herein.

Scan channel selection logic 114 can be used to mask the scan chains 112 such that, for example, only one of the scan chains 112 is observed at a time. As an example, the scan channel selection logic 114 can include AND gates 116 configured to AND together respective tail flops of the scan chains 112 with respective bits of an M-bit-wide shift register 118. In some examples, M=N. By shifting into the shift register 118 a masking value (which can be, in some examples, a logical "1", or, in other examples, a logical "0", depending on the implementation) at the beginning of a scan chain test procedure, and subsequently shifting the masking value through the shift register 118 between the testing of each of the N scan chains 112, each of the scan chains 112 can be observed independently. Outputs of the scan channel selection logic can be provided to a compressor 120 which can have, for example, a compression ratio that is the same as the decompression ratio of the decompressor 110, such that only a few bits are output through IC output ports 108, back into automated test equipment 102, for each several hundred test bits generated.

The automated test equipment 102 can have a scan channel slicer 112 configured to provide test inputs that are sliced for the scan channels, as described in greater detail below, using knowledge of the functioning of the decompressor 110 in the IC under test 104. Such knowledge may be provided by an IC decompressor model 124 in the ATE 102. Specifically, decompressor model 124 can provide decompressor linear equations needed to ensure that when an input test data stream is computed, all four bit-to-bit transitions ("0" to "0", "0" to "1", "1" to "0", "1" to "1") are ensured to be created. This computation of the input test data stream is decompressor hardware dependent, and the system 100 can correctly operate independent of the hardware present in decompressor 110 if model 124 provides the decompressor linear equations for the particular decompressor 110 in the IC under test 104. Scan channel slicer 122 can, for example, have knowledge of the functioning of different decompressors by including multiple such IC decompressor models 124. Which of the multiple decompressor models 124 is to be used can, in some examples, be automatically detected from the IC, or in some examples can be provided as a user-configurable setting.

ATE 102 in FIG. 1 can further include an automatic test pattern generator 126 to generate test patterns. An interface 128 can provide the hardware and/or software necessary to communicatively couple the ATE 102 to the IC 104. An IC 104 can be electrically coupled with the ATE 102, the ATE 102 can test the IC 104 (both its scan chains and its functional logic), the IC 104 can be decoupled from the ATE 102, and then the ATE 102 can then proceed to move on to testing another IC. The scan channel slicer 122 and/or the automatic test pattern generator 126 can be provided as machine-readable instructions read from a non-transitory memory and executed by a general-purpose processor, or can be provided as hardware-implemented digital logic, or as some combination of these.

Figure 2:
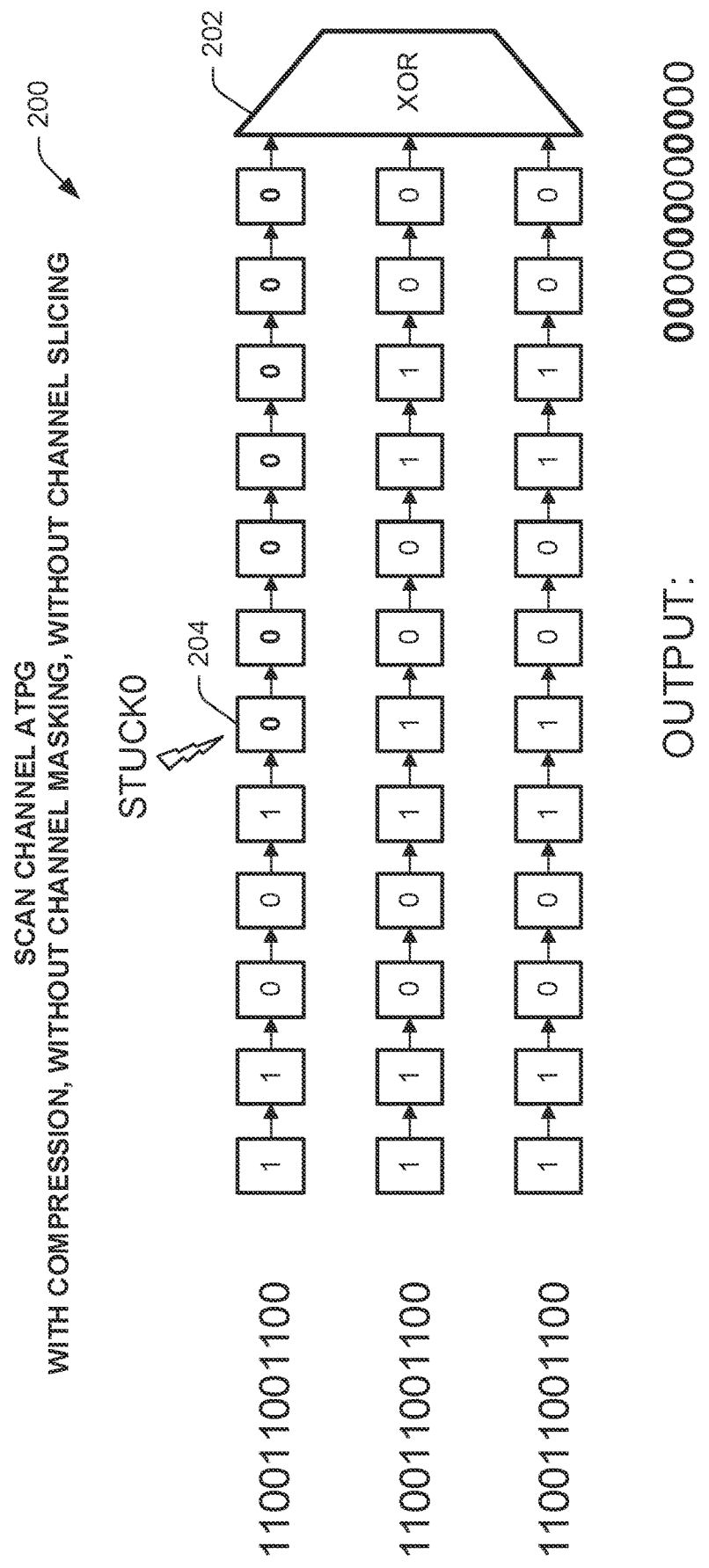
FIG. 2 is a diagram of an example scan chain test for a compression-mode architecture having three scan chains each twelve bits in length.

FIG. 2 shows a scan channel architecture 200 illustrating a test procedure for compression modes, without channel masking. In the illustrated example, three scan chains, each twelve flops in length, are loaded with identical input test patterns (e.g., "110011001100", a pattern configured to test all four fault types: a stuck "0" fault, a stuck "1" fault, a slow-to-rise fault, and a slow-to-fall fault). This loading can be done, for example, from decompressor logic (not shown in FIG. 2), coupled to the input flops of the scan chains (on the left side of the diagram of FIG. 2) that expands compressed test bits as may be provided, for example, from automated test equipment (not shown in FIG. 2). The architecture 300 accordingly has three channels corresponding, respectively, to the three scan chains. Although, for purposes of simplicity, the illustrated example architecture 200 has only three scan chains, having a maximum length of twelve flops, in practical examples, there may be many thousands of scan chains each having lengths of many thousands of flops, and the scan chains may be of different lengths with respect to each other within a given architecture.

The outputs of the scan chains in FIG. 2 are compressed (e.g., combined in a linear format) using compressor logic 202, illustrated as XOR compressor logic, and are thus brought down to a number of output ports smaller than the number of chains. In the illustrated example, the outputs of the three scan chains are compressed and reduced to a single output. In full scan mode, not shown, the three scan chains would be provided to three output ports, offering a direct output feed without any compression logic between scan chains and output ports. Standard test procedures for compression-based architectures such as the one shown in FIG. 2 can require many input patterns to test all chains for all fault types. Application of a test pattern involves specifying, through the input ports of an IC under test, a set of test values to be loaded into scan chains. Output values obtained at the output ports of the chip can be compared with expected output values, and if the expected values and the obtained values are not the same, then a failure can be identified from the output data. During ATPG, it may be required to apply a large number of patterns to test for all fault types. Generally, more patterns need to be applied in compression architecture examples than in full-scan ATPG. The systems and methods described in the present application reduce the number of patterns applied.

When digital circuitry is fabricated as semiconductor devices (e.g., on a silicon wafer), manufacturing process defects or design defects can cause defects within the circuitry that may cause the circuitry to behave in an unexpected or undesired manner. If the example architecture 200 were, instead, configured as full-scan logic, then if one of the scan chains was defective, e.g., having, as shown, a "stuck 0" fault at flop 204 in the first scan chain causing all values after the faulty flop 204 to be propagated as zeroes, then the effect of the fault could be seen directly at the faulty scan chain's corresponding output. In case of compression, however, due to the compressor logic 202, when the outputs of the three chains are compressed together, the information as to which chain contains the defective flop 204 is no longer derivable from the single compressed output. Had there been no defects in the scan chains, the observed output would have been identical to the input pattern, "110011001100".

Due to a defect in the sixth flop 204 of the first scan chain, marked by a lightning symbol to indicate a "stuck 0" fault, as the chain is loaded, all flops after the faulty flop 204 in the first chain are loaded with the value of zero. From the output from the compressor logic 202, which, as shown in FIG. 2, is a stream of all zeroes, it can be determined that one or more of the chains failed, but it is not possible to isolate the failure to any particular chain(s).

Figure 3A:
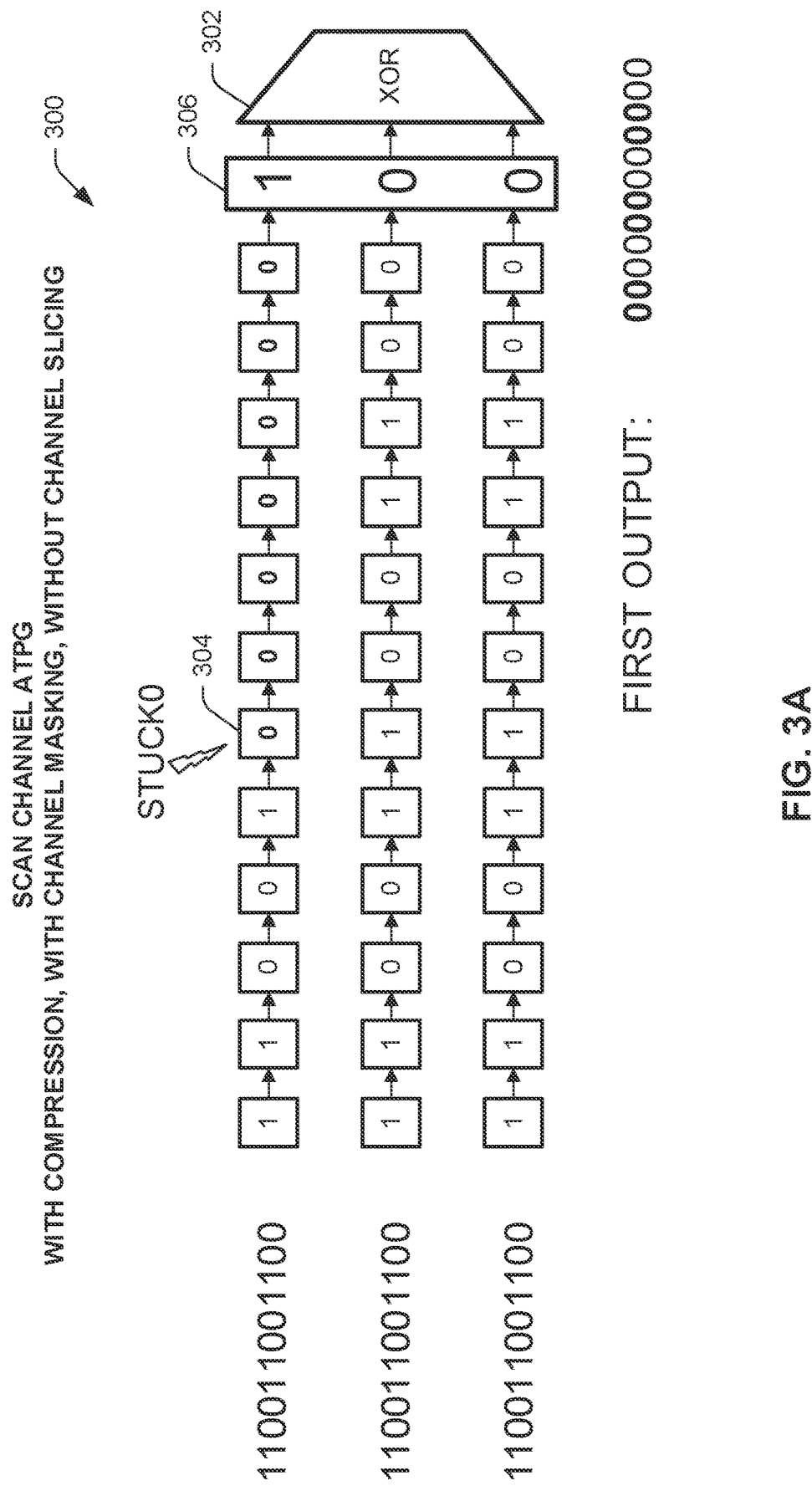
FIGS. 3A-3C are diagrams of an example scan chain test for a compression-mode architecture having three scan chains each twelve bits in length and having a mask register.
Figure 3B:
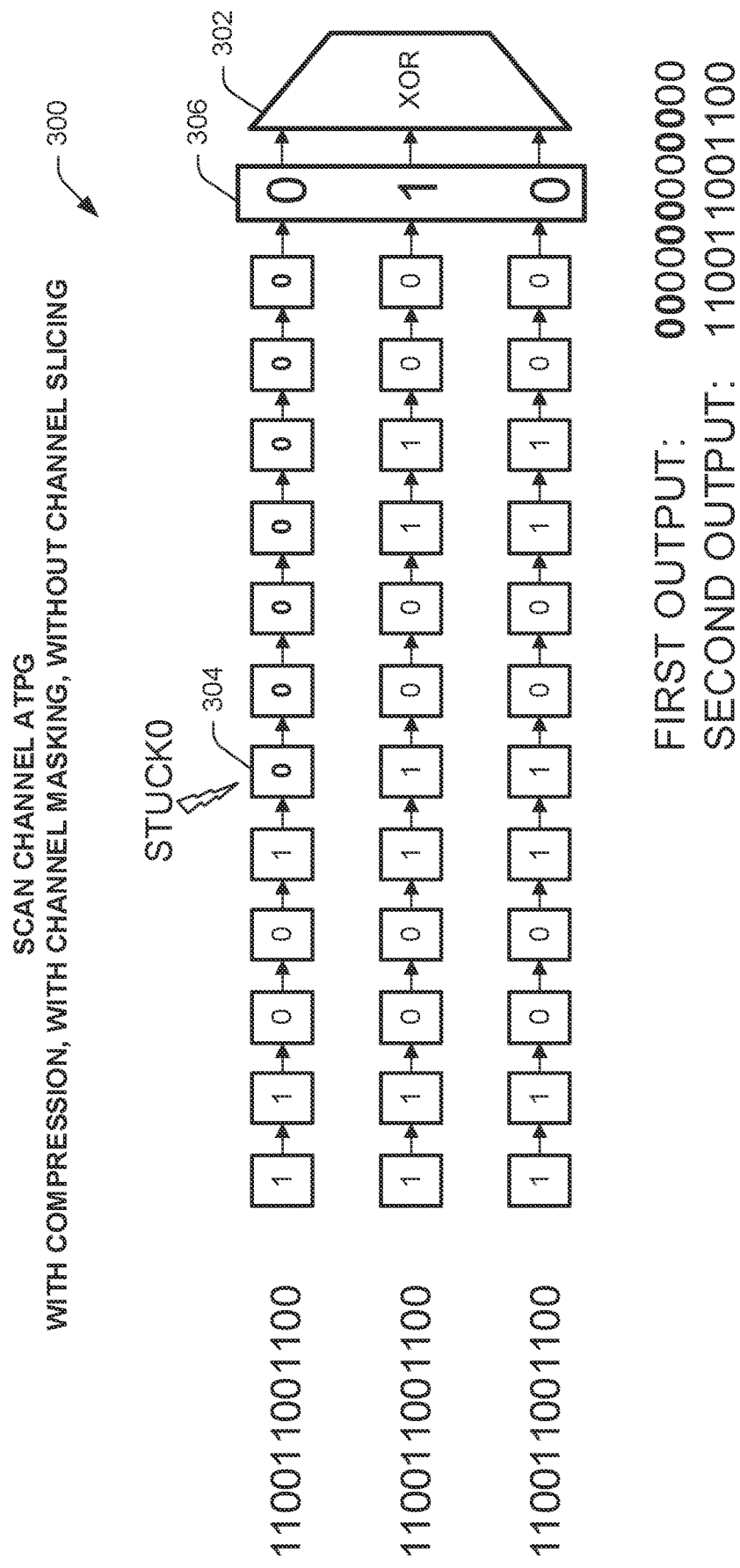
Figure 3C:
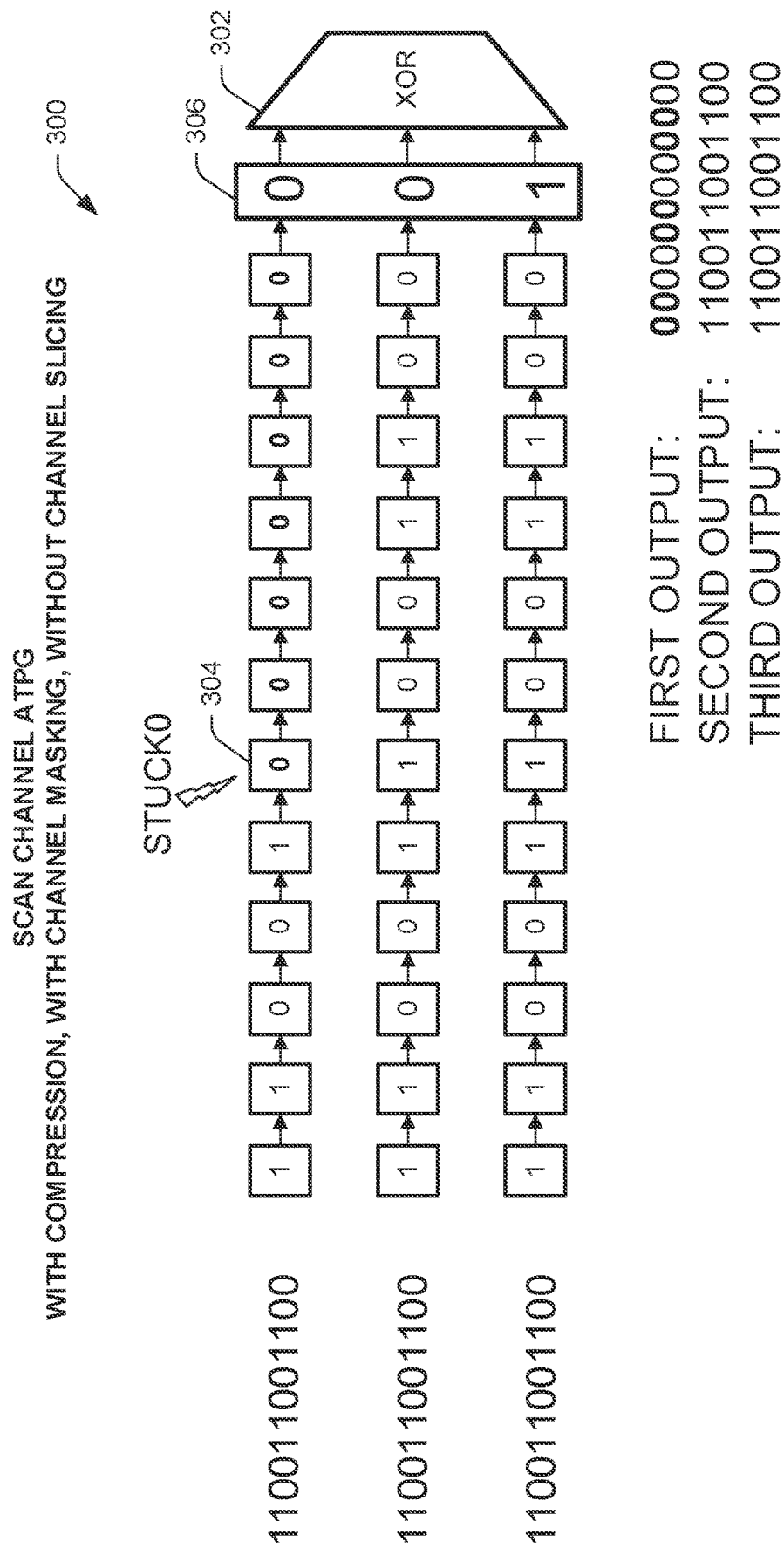

FIGS. 3A-3C illustrate an example test procedure using a channel masking architecture 300 that differs from the architecture 200 of FIG. 2 in that it includes a mask register 306 configured to enable debugging which particular scan chain has failed. Mask register 306 can correspond to scan channel selection logic 114 of FIG. 1 and can comprise, for example, AND gates and a shift register, as described above with respect to elements 116 and 118 of FIG. 1. For example, mask register 306 can be configured to include a shift register having as many bits N as there are scan chains in the architecture 300. For example, for each scan chain, a two-input AND gate in mask register 306 logically ANDs the output of the last scan chain flop and a corresponding flop of a shift register in mask register 306. The outputs of masked channels are zeroed out by the mask register, such that when the outputs of all the scan chains are combined into a single output by compressor logic 302, the compressed output permits observation of only one channel (the unmasked channel) at a time.

Just prior to the state illustrated in FIG. 3A, all three scan channels are loaded with the input test pattern ("110011001100"). A "100" masking pattern is loaded into the mask register 306, masking out the second and third channels with zeroes. (In other examples, not illustrated, a "011" masking pattern can be loaded into the mask register 306 to mask out the second and third channels with ones.) Then the data values in all three scan chains are loaded out, compressed by compression logic 302, and the first compressed output, shown as "000000000000" and corresponding to the output of the first channel, can be observed at the output. Next, all three scan channels are again loaded with the input test pattern, and a "010" masking pattern is loaded into the mask register 306, masking out the first and third channels with zeroes, bringing the architecture 300 to the state shown in FIG. 3B. (In other examples, not illustrated, a "101" masking pattern can be loaded into the mask register 306 to mask out the first and third channels with ones.) Then the data values in all three scan chains are loaded out, compressed by compression logic 302, and the second compressed output, shown as "110011001100" and corresponding to the output of the second channel, can be observed at the output. Finally, all three scan channels are again loaded with the input test pattern, and a "001" masking pattern is loaded into the mask register 306, masking out the first and second channels with zeroes, bringing the architecture 300 to the state shown in FIG. 3C. (In other examples, not illustrated, a "110" masking pattern can be loaded into the mask register 306 to mask out the first and second channels with ones.) Then the data values in all three scan chains are loaded out, compressed by compression logic 302, and the third compressed output, shown as "110011001100" and corresponding to the output of the third channel, can be observed at the output. Because the second and third compressed outputs match the expected output, which in this case is the input pattern, but the first compressed output does not, it can be determined that the first scan chain is the faulty one, and this scan chain can be further analyzed to localize the fault to a particular flop.

In the example illustrated in FIGS. 3A-3C, 36 test cycles are needed to load in test data (12 cycles for each of the three different unloads of the twelve-flop-long scan chains), and 12 more cycles are needed to unload output data to test the last of the three scan chains (unloading of outputs of the first two chains can be done contemporaneously with load-in cycles and do not add to the test cycle count). Additionally, 9 mask cycles are needed to load the mask register 306 three times, each such load taking three cycles. Altogether, the example test procedure shown in FIGS. 3A-3C requires a total of 57 test cycles. The total test cycle count for a simple mask pattern test procedure as illustrated in FIGS. 3A-3C can be expressed as $C=C_I+(2L+M)+(L+M)\times(N-1)$, where $C_I$ is the number of initialization cycles, N is the number of scan chains in the architecture, L is the maximum length of the scan chains (the length of the longest of the scan chains), M is the number of bits in the mask register (it is often the case that M=1V), and C is the total number of test cycles. Rearranging the above expression, the total test cycle count for a simple mask pattern test procedure as illustrated in FIGS. 3A-3C can also be expressed as $C=C_I+(L\times(N+1))+(M\times N)$, where the term $L\times(N+1)$ gives the number of scan cycles, and the term $M\times N$ gives the number of mask cycles.

Figure 4A:
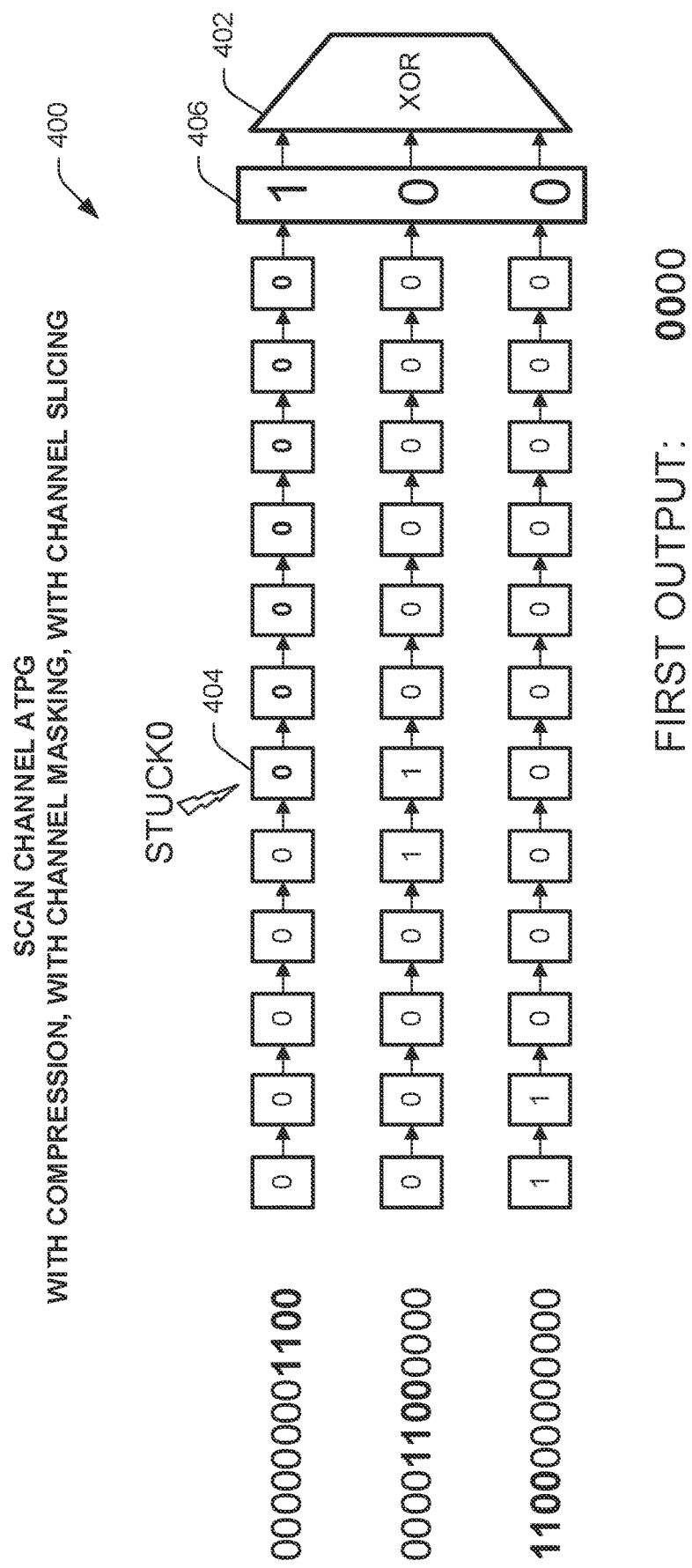
FIGS. 4A-4C are diagrams of an example scan chain test for a compression-mode architecture like that of FIGS. 3A-3C using testing channel slicing.
Figure 4B:
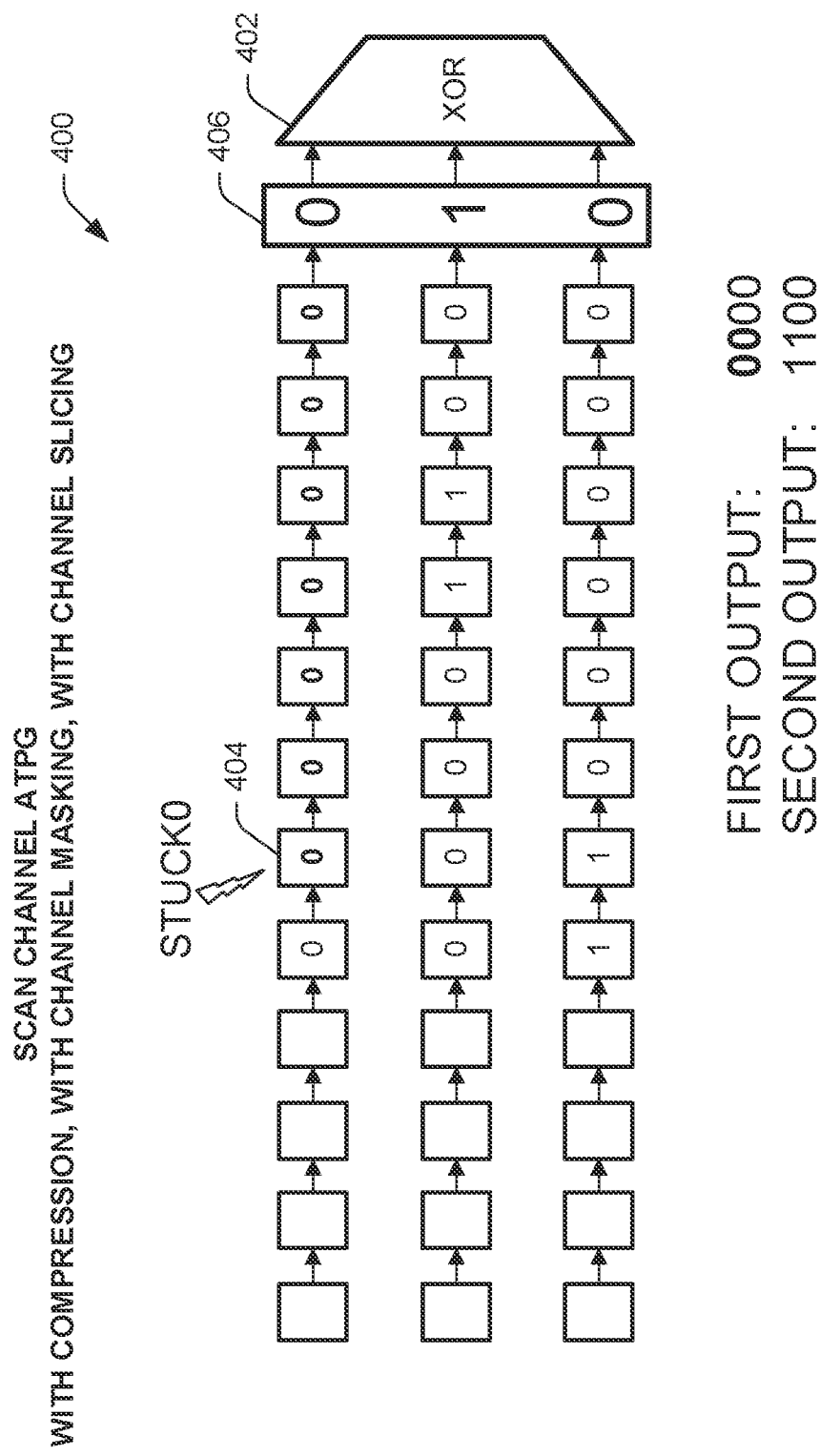
Figure 4C:
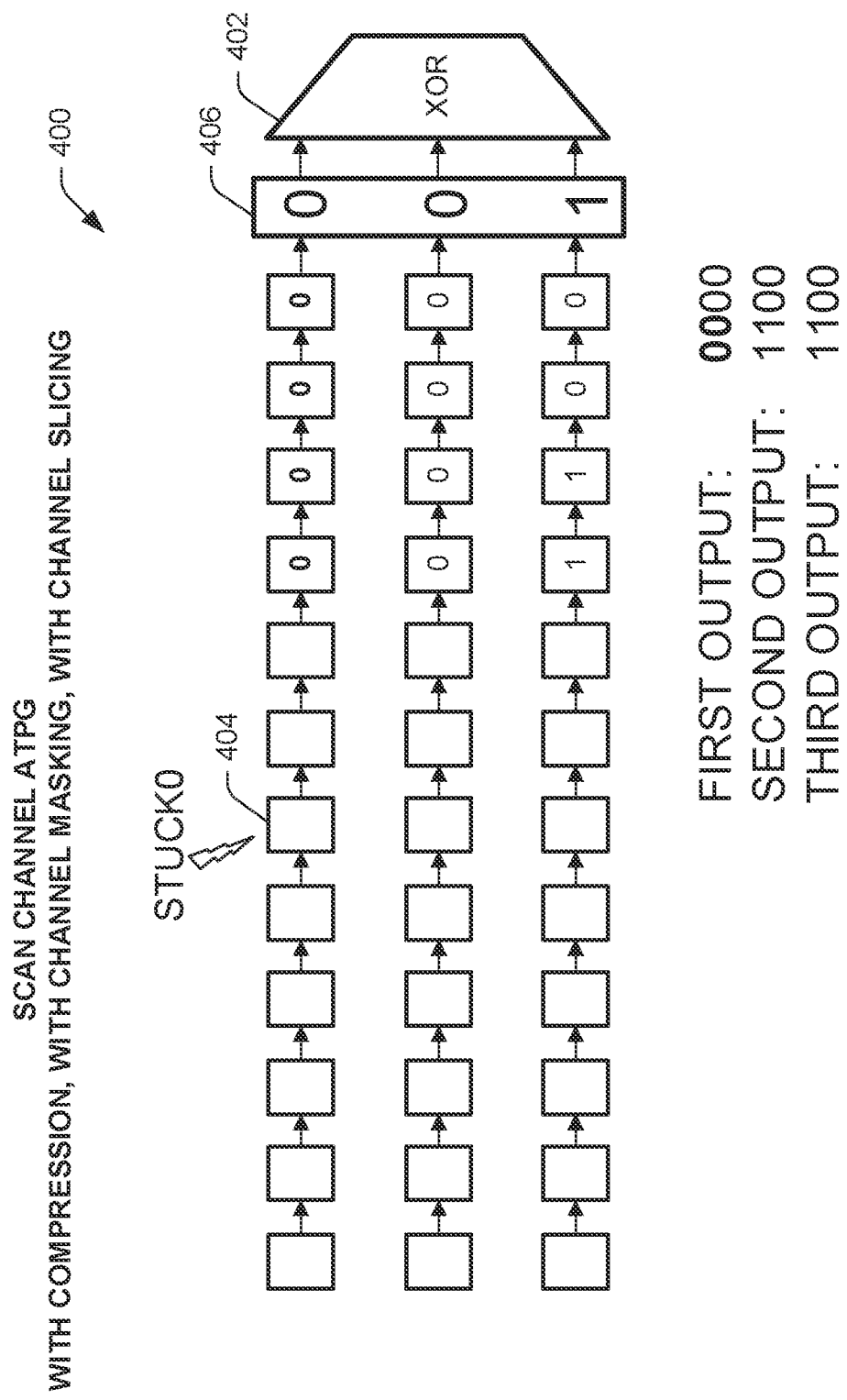

FIGS. 4A-4C illustrate an example test procedure using a channel masking architecture 400 that differs from the procedure of FIGS. 3A-3C in that the procedure illustrated in FIGS. 4A-4C uses scan channel slicing to reduce the number of test cycles required to complete the test procedure. Just prior to the state illustrated in FIG. 4A, the three scan channels are each loaded with different, low-power input test patterns that are sliced according to the individual channels. For simplicity of illustration, in the example of FIGS. 4A-4C, each of the three channels is sliced to the same test length of four bits, but in other examples, as described in greater detail below, longer slices may be required, and in some examples, the individual channels may be sliced to different numbers of bits. Thus, in examples not illustrated in FIGS. 4A-4C, a first channel may be able to be sliced to a test length four bits, but a second channel may need to be sliced to five bits, and a third channel may need to be sliced to a six-bit test length. On the left side of FIG. 4A, scan channel slices are illustrated as boldface portions of the initially loaded input patterns for each of the three channels.

In the example of FIGS. 4A-4C, the first channel is sliced to the first four input bits, and thus is provided with the input pattern "000000001100"; the second channel is sliced to the second four input bits, and thus is provided with the input pattern "000011000000"; and the third channel is sliced to the last four input bits, and thus is provided with the input pattern "110000000000". A "100" masking pattern is loaded into the mask register 406, masking out the second and third channels with zeroes. (In some examples, not illustrated, a "011" masking pattern can be loaded into the mask register 406 to mask out the second and third channels with ones.) Then, only the first four data values in all three scan chains are loaded out, compressed by compression logic 402, and the first compressed output, shown in FIG. 4A as "0000" and corresponding to the output of the first channel, can be observed at the output. Because this output differs from the expected output of "1100", a fault can be localized to the first scan chain.

In contrast to the procedure illustrated in FIGS. 3A-3C, it is not required to re-load any or all of the three scan chains (channels) with input test patterns again to test the second scan chain (channel). Instead, the masking bit (which is a "1" in the illustrated example, but could be a "0" in other examples, not illustrated) is shifted in the mask register 406 (e.g., by shifting a "0" into the input of the mask register 406, or in other examples, not illustrated, by shifting a "1" into the input of the mask register 406), consuming only a single test cycle, and the architecture 400 is setup for the testing of the second channel, as shown in FIG. 4B. Then the second four bits of the data values in all three scan chains are loaded out, compressed by compression logic 402, and the second compressed output, shown as "1100" and corresponding to the output of the second channel, can be observed at the output. The masking bit is shifted once more (e.g., by shifting another "0" into the input of the mask register 406, or in other examples, not illustrated, by shifting another "1" into the input of the mask register 406), again consuming only a single test cycle, and the architecture 400 is setup for the testing of the third channel, as shown in FIG. 4C. The last four bits of the data values in all three scan chains are loaded out, compressed by compression logic 402, and the third compressed output, shown as "1100" and corresponding to the output of the third channel, can be observed at the output. Because the second and third compressed outputs match the expected output, but the first compressed output does not, it can be determined that the first scan chain is the faulty one, and this scan chain can be further analyzed to localize the fault to a particular flop 404.

In contrast to the test procedure of FIGS. 3A-3C, which required 57 test cycles, the test procedure of FIGS. 4A-4C required only 24 scan cycles (12 to load and 12 to unload) plus 5 mask cycles (3 cycles for an initial load plus 2 shifts) for a total of 29 cycles. With scan channel slicing, it is not necessary to unload the entire chain length to test each chain. Additional cycle savings is accomplished with scan channel slicing by shifting the mask register by a single bit for each channel observation, rather than loading the entire mask register for each channel observation, such that only one mask cycle is incurred between observations of different channels. However, as described below, when scan channel slicing is employed, the provided test pattern needs to be designed to accommodate the decompression logic of the test architecture. The total test cycle count for a simple mask pattern test procedure as illustrated in FIGS. 4A-4C can be expressed as $C=C_I+(L+M)+S\times N+(N-1)$, where $C_I$ is the number of initialization cycles, N is the number of scan chains in the architecture, L is the maximum length of the scan chains (the length of the longest of the scan chains), M is the number of bits in the mask register (it is often the case that M=1V), S is the minimum number of cycles needed to test a scan chain (e.g., S=4 with the pattern "1100"), and C is the total number of test cycles. Rearranging the above expression, the total test cycle count for a simple mask pattern test procedure as illustrated in FIGS. 4A-4C can also be expressed as $C=C_I+(L+S\times N)+(M+N-1)$, where the term $L+S\times N$ gives the number of scan cycles, and the term $M+N-1$ gives the number of mask cycles. In cases where scan chains are of uneven length, the scan chains can be arranged to be tested from shortest to longest, such that the last test values unloaded are those of the longest chain (of length L).

FIGS. 5-8 are listings of scan pattern templates of the type written in languages such as IEEE Standard Test Interface Language (STIL) or Waveform Generation Language (WGL), tester languages in which ATPG patterns are written out. Each template includes a number of events encapsulated within a procedure. For each of these events, there may be one or more arguments specified by the tester language, which may specify such things as test values to be loaded or pins onto which values are provided. These arguments are not shown in FIGS. 5-8 for any of the respective events in the listings. For example, in a test architecture having four channels (scan chains), each four flops long, a Scan_Load( ) event may specify via an argument the values of 16 bits of data corresponding to input data loaded into the flops of scan chains.

The listing of FIG. 5 shows an example scan pattern template for a test performed using a simple full-scan test mode without any compression. A single Scan_Load( ) event at line 002 loads all of the input test data onto all of the scan chains in the test architecture in one go, and a single Scan_Unload( ) event at line 003 unloads all of all the output test data from the scan chains in one go. The number of cycles used by the Scan_Load( ) event is the same as the length of the longest scan chain in the test architecture. The number of cycles used by the Scan_Unload( ) event is, likewise, the same as the length of longest scan chain. Depending on the failing scan-out (the output pin on which a failure is detected), the failing scan chain can be identified.

The listing of FIG. 6 shows an example scan pattern template used in case of the presence of compression architecture (e.g., with XOR compression architecture), but without a decompressor. The listing of FIG. 6 is effectively an extension of the full-scan scan template of FIG. 5 with the addition of mask events. Like the listing of FIG. 5, the listing of FIG. 6 also has the Scan_Load( ) event at line 002. The number of cycles used by the Scan_Load( ) event is same as the length of longest scan chain in the test architecture. The Scan_Load( ) event loads all scan chains in one go, and loads the same test data values into every scan chain. Next, there are two masking events corresponding to the mask register, the Load_Channel_Masks( ) event of line 003 and the Use_Channel_Masks( ) event of line 004. The Load_Channel_Masks( ) event designates what values are to be fed into the mask register. For example, if the mask register is of length 100 (corresponding, for example, to an architecture having 100 different scan chains), there will be 100 bits of data for the Load_Channel_Masks( ) event. The Load_Channel_Masks( ) event thus specifies the order of the bits to be loaded into the mask register.

The Use_Channel_Masks( ) event of FIG. 6 specifies the cycles in which the masking logic (the mask register and associated AND gates) is to be activated; in most cases, the masking logic will be activated for all testing cycles. If the maximum scan chain length is 100, the Use_Channel_Masks( ) event will have 100 bits; a "1" bit within these 100 bits implies that the masking logic should be used in the corresponding state during testing, whereas a "0" bit within these 100 bits implies that the masking logic should not be used in the corresponding state, and the scan chain data is fed directly to the compressor logic without being masked. The Compressed_Output_Stream( ) event at line 005 of the listing of FIG. 6 provides the final output data at the primary output (PO) pins to which the output of the compressor logic is coupled. The number of cycles used by the Compressed_Output_Stream( ) event is same as the length of the longest scan chain in the test architecture. The Compressed_Output_Stream( ) event unloads output data from all scan chains in one go.

The events indicated by outline 602 of FIG. 6 can be repeated N times, where N is the number of scan chains, to provide an overall scan pattern that tests one channel at a time, by loading all the channels, feeding the mask register, then unloading output data from only the first channel. In such case, the Load_Channel_Masks( ) event can be configured to observe only one chain at a time. Thereafter, the testing continues by loading all the channels again, feeding the mask register to observe only the second channel, and then unloading the corresponding output data. This set of events 602 is iteratively repeated until all the chains have been observed. Notably, the Scan_Load( ) event and the Compressed_Output_Stream( ) event respectively load or unload all the data into or out of all the scan chains, even though only one channel is observed at a time by the operation of the masking logic as controlled by the Load_Channel_Masks( ) and Use_Channel_Masks( ) events.

Whereas the listing of FIG. 6 shows an example template for a compression test mode without a decompressor, the listing of FIG. 7 shows a template for a compression test mode with a decompressor. In the presence of the decompressor, which is towards the scan-in side, instead of a simple Scan_Load( ) event, a Compressed_Input_Stream( ) event on line 002 is used to specify a reduced number of bits that are provided to input pins for provision to decompressor logic that, in turn, provides input test data into the multiple scan chains of the test architecture. As with the Scan_Load( ) event, the number of cycles used by the Compressed_Input_Stream( ) event is same as the length of longest scan chain in the test architecture, and the Compressed_Input_Stream( ) event loads all scan chains in one go. However, unlike the Scan_Load( ) event, the Compressed_Input_Stream( ) event does not load the same test data values into every scan chain, but instead, the load data is the same for a group of chains, without necessarily being the same for all chains.

In tests using the previous example templates of FIGS. 5 and 6, the load data would be the same for all N chains. However, in the case of a test architecture having decompressor logic, the load data cannot be guaranteed to be the same for all the chains. In this case, because the linear combination of data is formed of the input data, all the channels cannot be tested with the same load data. Instead, there will be different set of load data for each group of chains. For example, in a test architecture having ten channels (ten scan chains), the load data for a first set of five channels may be one set of input bits corresponding to a decompressed input stream, and the load data for a second set of five channels may be a different set of input bits corresponding to a different decompressed input stream. The precise composition of input bits from group to group may vary based on the decompressor logic.

The remainder of the listing of FIG. 7 remains the same as the listing of FIG. 6. The Load_Channel_Masks( ) event of line 003 designates what values are to be fed into the mask register, so as to enable, in effect, the unloading of only one scan chain at a time. The Use_Channel_Masks( ) event line 004 is specified for all cycles. The Compressed_Output_Stream( ) event at line 005 provides the final output data at the primary output (PO) pins to which the output of the compressor logic is coupled. The number of cycles used by the Compressed_Output_Stream( ) event is same as the length of the longest scan chain in the test architecture. The Compressed_Output_Stream( ) event unloads output data from all scan chains in one go. The events indicated by outline 702 of FIG. 7 can be repeated N times, where N is the number of scan chains, to provide an overall scan pattern that tests one channel at a time, by loading all the channels, feeding the mask register, then unloading output data from only the first channel. The Load_Channel_Masks( ) event can be configured to observe only one chain at a time. The set of events 702 is iteratively repeated until all the chains have been observed.

Figure 8:
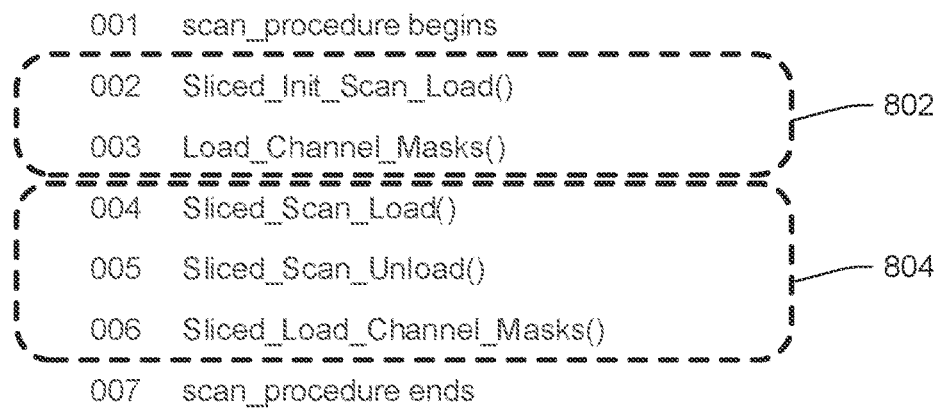
FIG. 8 is a listing of an example scan pattern template for use in a scan chain pattern slicing test procedure, with or without decompression.

The listing of FIG. 8 shows a sliced scan pattern template for use with a test architecture either with or without a decompressor. Two events 802 constitute an initial scan and mask load. Sliced_Init_Scan_Load( ) on line 002 loads all scan chains together with low-power load data, as discussed in greater detail below. Once the load data is loaded on the scan chains, the mask register is also loaded with an initial load event, Load_Channel_Masks( ) on line 003, setting the mask register to observe the first chain. This load uses M cycles, where M is the length of the mask register. In usual examples, M is equal to N, the number of scan chains.

Thereafter, three slice set events 804 are repeated N times, that is, as many times as the number of chains, but these events 804 are not the same as events described above with regard to FIGS. 5-7. The slice set events 804 load and unload only the corresponding bits of load data that are to be observed from each channel, a subset of the entire load data earlier loaded with the Sliced_Init_Scan_Load( ) event. The Sliced_Scan_Load( ) event at line 004 loads $k_n$ bits of test data corresponding to the channel n to be observed later. The Sliced_Scan_Unload( ) event at line 005 unloads $k_n$ cycles of data to observe the nth channel. The Sliced_Load_Channel_Masks( ) event at line 006 pulses only one cycle at a time in the mask register to observe the next channel. The difference between the template of FIG. 8 and the template of FIG. 7 is that, whereas in the template of FIG. 7, the Load_Channel_Masks( ) event loads the entire mask register, in place of that event in FIG. 8, the Sliced_Load_Channel_Masks( ) event needs to pulse only one cycle at a time, and the Sliced_Scan_Load( ) and Sliced_Scan_Unload( ) events need to load or unload the requisite number of cycles for the particular channel being observed (the nth channel of N total channels) only. The patterns are dynamic in that the number of bits unloaded (the k) may vary with channel, hence the n subscript, denoting an nth channel, in the notation $k_n$. Despite events 804 being repeated N number of times for the N channels (the N scan chains), overall, the cycle count of the test procedure executed by the template of FIG. 8 is lower than the cycle count of the test procedure executed by the template of FIG. 7.

The sliced load data loaded into the channels when using a scan channel slicing method is of lower power than non-sliced load data. Because only one channel is tested at a time, the corresponding scan chain need only be provided with sufficient transitions to test all fault types. The table of load data values on the left of FIG. 4A provides an example, and can be compared with the table of load data values on the left of FIG. 3A, showing load data for a non-sliced example. The load data consists of transition data (shown in boldface) in FIG. 4A and remainder cycles, which can be loaded as, for example, all zeroes (or in some examples, not shown, as all ones).

With a non-sliced method as shown in FIGS. 3A-3C, a pattern containing all transition data was fed into all the cycles. By contrast, with a scan channel slicing method, because a scan chain is only tested for a subset of cycles (four cycles in the example of FIGS. 4A-4C), all the remainder cycles can be loaded with zeroes. Because there is no voltage transition between successive zeroes (or successive ones, in the case that remainder cycles are loaded as all ones), the load data when channel slicing is used is comparatively lower power. In semiconductor logic devices, dynamic power is associated with switching because it is in large part due to power losses from charging and discharging of the internal capacitances (e.g., gate capacitances) of transistors within digital logic elements such as gates and inverters. If a continuous stream of zeroes (or a continuous stream of ones) is input into a digital inverter or a digital logic gate such that the logic state of the inverter or gate is not changed during the duration of the stream (e.g., as bits are shifted through a measure register), the dynamic power consumption within the inverter or gate for the duration of the continuous stream is substantially zero. However, if the inverter or gate is toggled between high and low states with a certain clock frequency, the dynamic power consumption is proportional to the clock frequency at which the inverter or gate is toggled.

The order of transition data in load data for a particular chain depends on the order of bits in the masking logic. For example, if the first chain is observed in the first k=4 cycles, the first chain is loaded with the transition data (the test cycles) in the first 4 cycles, and the remainder cycles in the load data for the first chain are fed with all zeroes. Similarly, for the second chain, in which only the middle four bits of the load data are observed, the first four bits and the last four bits are loaded with zeroes. Likewise, for the third chain, in which only the last four bits are observed, the first eight bits are loaded with zeroes. This loading can be done with the Sliced_Init_Scan_Load( ) event of line 002 of FIG. 8 during the initial, non-iterated phase 802. The transition data is loaded only for the set of cycles to be tested in a particular chain. In the illustrated example of FIGS. 4A-4C, the first chain is only loaded with transition data for cycles 1-4; the second chain is only loaded with transition data for cycles 5-8; and the third chain is only loaded with transition data for cycles 9-12. Information about which cycles contain transition data within each channel can be maintained in a database, as described in greater detail below. No switching is performed, and substantially no dynamic power is expended, for all the other cycles for which a given chain is not being tested. This is because, before and after the transition data, the remainder cycles are all zeroes, and thus there is essentially no charging and discharging of the internal capacitances of the transistors in the flops that make up the scan chains under test as remainder cycles propagate through the scan chains. Therefore, the dynamic power consumption expended within the scan chains is almost zero except for the portion of the pattern that is transition data. The overall power consumption with the sliced scan pattern template is much lower as compared to standard pattern templates.

Figure 9A:
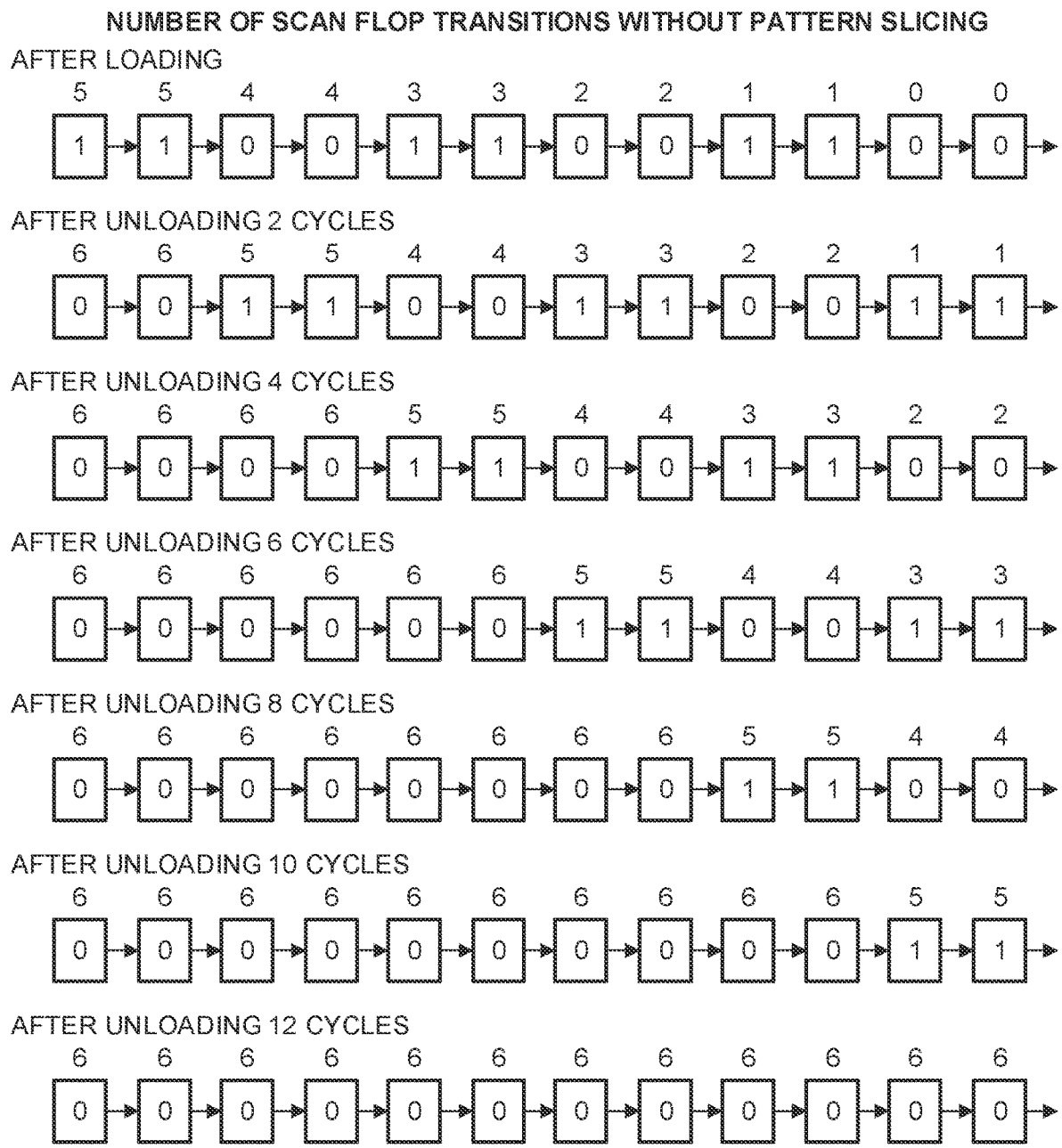
FIG. 9A is a diagram of an example scan chain showing the number of scan flop transitions without pattern slicing.
Figure 9B:
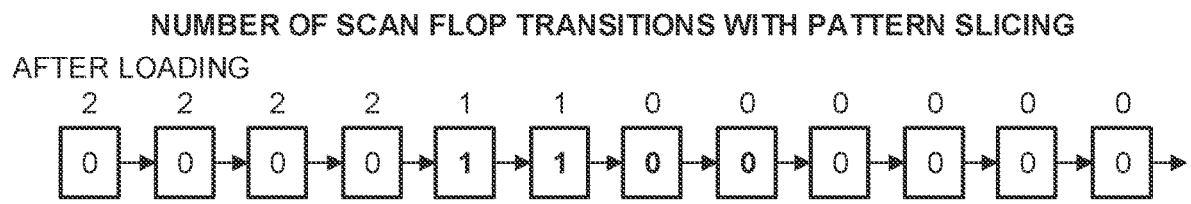
FIG. 9B is a diagram of an example scan chain showing the number of scan flop transitions with pattern slicing.

The scan chain diagrams of FIGS. 9A and 9B, along with the following description, provide an estimate of power savings in a scan channel slicing test procedure (as shown, for example, in FIGS. 4A-4C) as compared to a non-sliced procedure (as shown, for example, in FIGS. 3A-3C). The number of scan chains in the design is N, and the average number of flops in each scan chain is L, such that the total number of scan flops in the design is N×L. The minimum number of cycles needed to test a measure register is S (e.g., S=4 with a transition pattern of "1100"). In a non-sliced scan chain pattern, such as the one shown in FIG. 9A, during loading, each scan flop undergoes a number of transitions as shown in the counts labeling the flops in FIG. 9A (shown above each flop). For a twelve-flop scan chain, there are five transitions incurred in loading, plus one additional one transition incurred in unloading, for a total of L/2=6 transitions per flop considering both loading and unloading of scan chain. FIG. 9B shows the transitions in a sliced scan chain pattern after loading. With channel slicing, for a twelve-flop scan chain, there are only S/2=2 transitions. The transition savings becomes even greater with increased scan chain length and number of scan chains because, although the number of scan flop transitions in the non-sliced example continues to increase with increased scan chain length, the number of scan flop transitions in the sliced example stays constant with increased scan chain length. Generally, the total number of transitions in a non-sliced scan chain pattern is in order of N×L×L/2=$L^2$N/2. In a sliced scan chain pattern, each scan flop goes through a maximum of S/2 transitions (e.g., 2, if S=4). The total number of transitions in the sliced scan chain pattern is thus in the order of N×L×S/2. Since L>>S for practical implementations, the number of transitions with a pattern slicing test procedure are significantly reduced when compared to a non-sliced approach. The power saved with the slicing procedure is proportional to this transition reduction.

Figure 10:
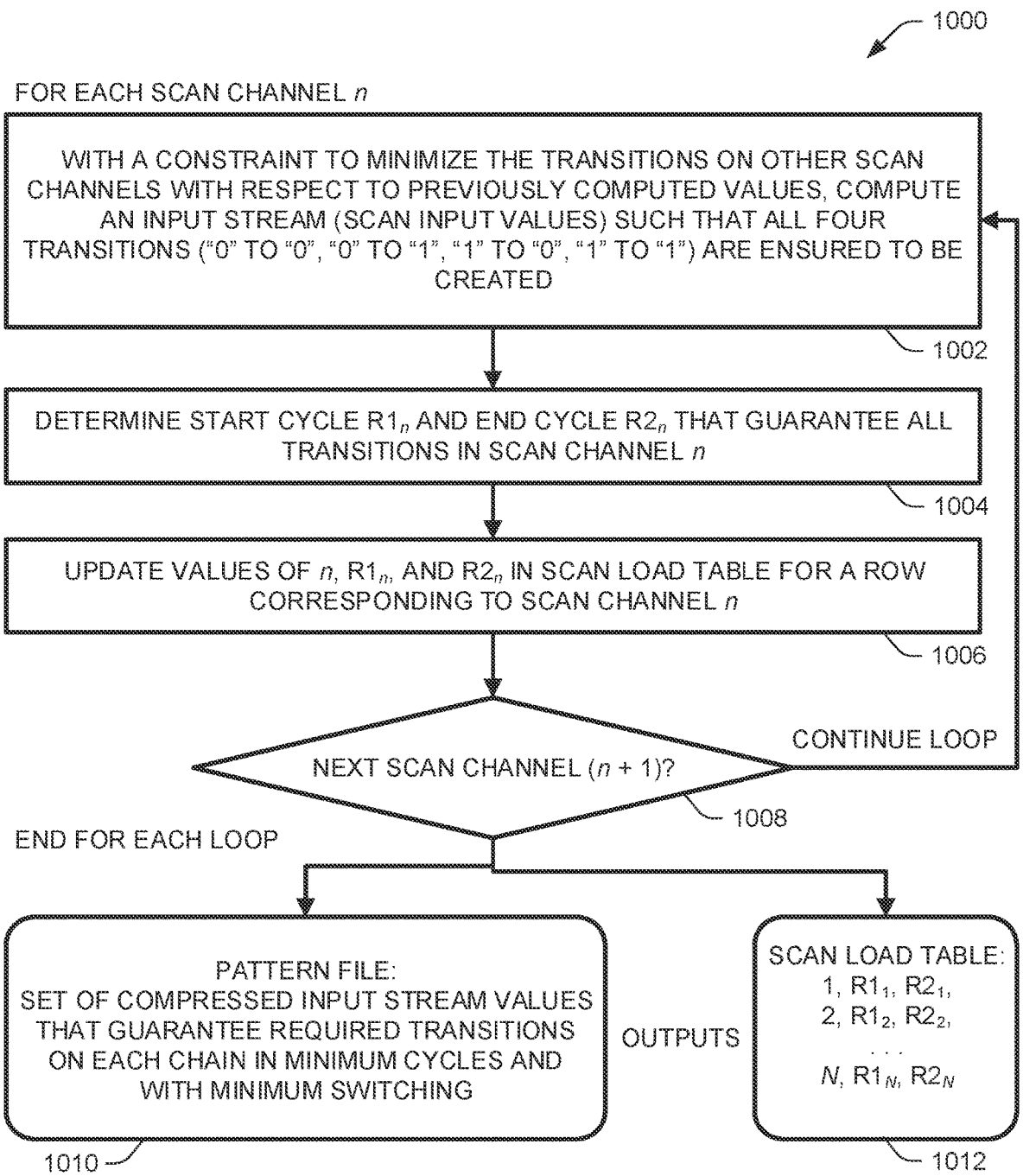
FIG. 10 is a flow chart showing an example scan chain load method.

As described above, the minimum transition data that can accomplish testing of all four fault types is the four-bit sequence "1100" (or, in some cases equivalently, "0011"). However, due to the decompressor hardware, it is always not possible to guarantee the loading of a "1100" (or "0011") transition data sequence in each channel, and it is also not possible to generate all zeroes (or all ones) in a channel as remainder cycles (cycles in which the channel is not observed). The flow chart of FIG. 10 provides an example method 1000 for generating a low-power scan load for all channels. The following explanation of compression technologies in test is first provided.

If all the flops of a complex digital logic design are connected into a single scan chain, a single scan input port can be used to shift test input values into the sole scan chain, and a single scan output port can be used to shift result values out of the sole scan chain. In such a test architecture, the number of input/output ports is minimal, but the with the disadvantage that the length of the scan chain will be the number of flops in the design, increasing test time. Testers are costly and may be charged per hour. Increasing the number of scan chains allows loading and unloading to be done in parallel, reducing test time, but increases the number of input/output ports (pins) needed.

For example, some designs use about eight pins for input and output of test data. Compression technologies address the issue of the explosion of the number of pins. The use of compression technologies in the test design permits the loading of compressed input values on a small set of pins (e.g., four pins), which are decompressed by a decompressor into, for example, hundreds of internally generated test values that can be provided to individual scan chains. On the output side, test output values provided from the scan chains are compressed into a signature by a compressor for output over a small number of output pins.

Compression helps satisfy the DFT objective of restricting the number of pins without compromising on the number scan chains. However, with the use of compression comes the drawback of limited control as to precisely what test values can be loaded onto a given scan chain. For example, when the inputs of scan chains are coupled to the outputs of a decompressor, such that only compressed inputs can be provided to the scan chains via the decompressor, it may not be possible to set the scan chain flops to chosen values. For instance, if it is desired to set a value of "1" on a first flop, a "0" on a second flop, and a "1" on a third flop, the decompressor may not be able to guarantee this particular combination of values, because there are only a small set of pins that generate these values. By contrast, in architectures that do not use compression, there is full control over the values loaded into scan chains. With use of a decompressor, the combinations of values generated and loaded into the scan chains is, at times, at the mercy of the decompressor logic, and it is not possible to guarantee initial load data (e.g., as shown on the left in FIG. 4A) having a minimal number of transitions that still guarantee all fault types are tested.

For example, when testing a first channel, it may be desired that the first four test data values in and out of the corresponding scan chain be "1100" (the transition values), and the rest of the test data values be zeroes (the remainder cycles). However, the compressor may decompress compressed test data into transition values of, for example, "10101", or some different combination of values, rather than the intended "1100" values. Slicing methods therefore should operate to slice a channel until all the transitions are tested by the values in that channel. In doing so, the transition values may end up numbering more than four. In some instances, depending on what values can be produced by the decompressor, the transition values may number five, or six, or sometimes more. It is further desirable that the decompressor logic load values into the remainder cycles such that the number of transitions (value switches) in the remainder cycle stream is minimized to reduce dynamic power consumption, as described above. However, owing to the operation of the decompressor, it may not be possible to guarantee that all remainder cycles are loaded with a constant value, such as zeroes, or ones. However, in some examples, the number of transitions during remainder cycles (those cycles outside of the channel slices containing the guaranteed transition cycles of interest) is maintained to less than about 10 percent, e.g., less than about 5 percent, e.g., less than about 1 percent, e.g., less than about 0.5%.

The method 1000 of FIG. 10 iterates over each of the N scan channels to generate load data 1010 and to create a scan load table 1012 of N rows that can be referred to during a scan channel slicing load procedure. The method 1000 of FIG. 10 can, for example, be executed as part of a Sliced_Init_Scan_Load( ) event as called in the listing of FIG. 8. For each scan channel n among the N scan channels, a compressed input stream (the scan input values) is computed 1002 such that all the four transitions ("0" to "0", "0" to "1", "1" to "0", "1" to "1") are ensured to be created within some subset of the input stream when decompressed and provided to a given scan chain in the IC under test. This subset (the transition data) is ideally only four bits in length, but, depending on the decompressor, may be greater than four bits in length. This compressed input stream is computed 1002 under a constraint placed to minimize the transitions on other scan channels with respect to previously computed values. The constraint implies that when the computation is done to acquire all four transitions in a given channel, there should be a minimum number of transitions in all other channels, in accordance with the limitations of the decompression logic (which may make it impossible to provide a zero number of transitions in all other channels), to reduce overall power. With reference also to FIG. 1, given this constraint, the input stream computation 1002 can be informed, for example, by a decompressor model 124 known to the scan channel slicer 122 performing the input stream computation 1002, which decompressor model 124 provides information about the decompressor 110 expected in the IC under test 104. A start cycle $R1_n$ and an end cycle $R2_n$ are determined 1004 from the computed input stream, for example, by examining the input stream to find (from its decompressed counterpart) the aforementioned subset (the transition data) containing all four transitions. The start cycle $R1_n$ can be set at the beginning of the subset and the end cycle $R2_n$ can be set at the end of the subset. A scan load table 1012 can be updated 1006 with the values of scan channel number n, start cycle $R1_n$, and end cycle $R2_n$, associated with the transition data that will be loaded into the scan channel n.

If all N scan channels have not yet had input streams computed for them and had start cycle and end cycle entries created for them in the scan load table 1012, then n can be incremented (to n+1) to proceed to the next scan channel 1008, continuing the "for each" loop of actions 1002, 1004, 1006. When the loop exits, the outputs of the method 1000 are the pattern file 1010, containing the set of compressed input stream values that guarantee required transitions (e.g., of all four transition types) on each chain in a minimum number of cycles and with minimum switching in view of the limitations of the decompressor logic, and the scan load table 1012. Table 1, below, provides an example scan load table. As discussed in greater detail below, the value T of the end cycle $R2_N$ of the last channel N can be larger than the longest channel length L.

TABLE 1

Example scan load table

| Scan channel (n) | Start cycle ($R1_n$) | End cycle ($R2_n$) |
|---|---|---|
| 1 | 1 | 5 |
| 2 | 6 | 10 |
| 3 | 11 | 17 |
| N (last channel) | $R2_{N-1} + 1$ | T |

Once the scan load table 1012 has been generated along with the pattern file 1010, a correct set of values can be loaded as part of the Sliced_Scan_Load( ) event of FIG. 8, such that each channel gets tested one by one. The scan load table 1012 computed beforehand can be looked to for generating the slice pattern, channel by channel. As set forth in the following description, scan load complications can arise when the maximum length L of the scan chains is shorter than the length needed to test all channels with an initial load (e.g., when $R2_{n-1} > L_n$) or when the chain length L is not a multiple of the number of slice cycles.

After the initial load of decompressed load data, transition data for some scan chains may be fed in to those scan chains, but perhaps transition data will not have been fed into all scan chains, depending on scan chain length and the number of slice cycles. Referring to the example of FIGS. 4A-4C in conjunction with the pattern template of FIG. 8, and supposing the scan chain length L were 8 flops uniformly (instead of the L=12 as illustrated), then load data loaded in by the Sliced_Scan_Load( ) event in first slice set 804 will be for scan chain 3 (the bottom scan chain depicted). This will be the case even though the scan chain observed in first slice set 804 (via the Sliced_Scan_Unload( ) event) is chain 1 (the top scan chain depicted). Slice loading is further complicated if chain length is not multiple of the number of slice cycles. For example, if the chain length L were uniformly 10 flops (instead of the L=12 as illustrated), then by an initial load (via the Sliced_Init_Scan_Load( ) event), only two cycles of load data for scan chain 3 is loaded, rather than all four. In such a circumstance, after the initial load, in each slice set 804, two cycles of load data (via the Sliced_Scan_Load( ) event) will be for one chain and other two cycles of load data will be for a next chain, rather than all four cycles of load data being for the same chain. The information needed to ensure that these complications are addressed can be pre-computed and stored in the scan load table 1012. The data can be fetched from the scan load table on the fly whenever a load pattern is generated.

The above complications can be further illustrated by the following additional example. Referring again to the example of FIGS. 4A-4C in conjunction with the pattern template of FIG. 8, assuming that the maximum scan chain length L in the design is only 12 flops, after the initial scan load (via the Sliced_Init_Scan_Load( ) event), if there were to be a fourth channel (not shown in FIGS. 4A-4C), the next load (via the Sliced_Scan_Load( ) event) would be testing the fourth channel through that load, so the scan load data corresponding to the fourth channel would need to be provided for the first Sliced_Scan_Load( ) event, but the Sliced_Scan_Unload( ) event for the first slice set 804 will be for the first channel and the Sliced_Load_Channel_Masks( ) event will be for next channel since first channel is set to be observed with Load_Channel_Masks( ) event. This is because the first channel is observed in the first slice set 804. For the first slice set 804, the Sliced_Scan_Load( ) event corresponds to the fourth channel, the Sliced_Scan_Unload( ) event corresponds to the first channel, and the Sliced_Load_Channel_Masks( ) event corresponds to second channel. From the scan load table 1012, it can be determined how many cycles of data have been loaded in the initial scan load, and which is the next cycle that is going to be loaded. Thus, supposing that the next cycle to be loaded is the eleventh cycle, it can be determined that the channel being tested is channel number three, and thus the load data corresponding to that channel is needed.

Figure 11:
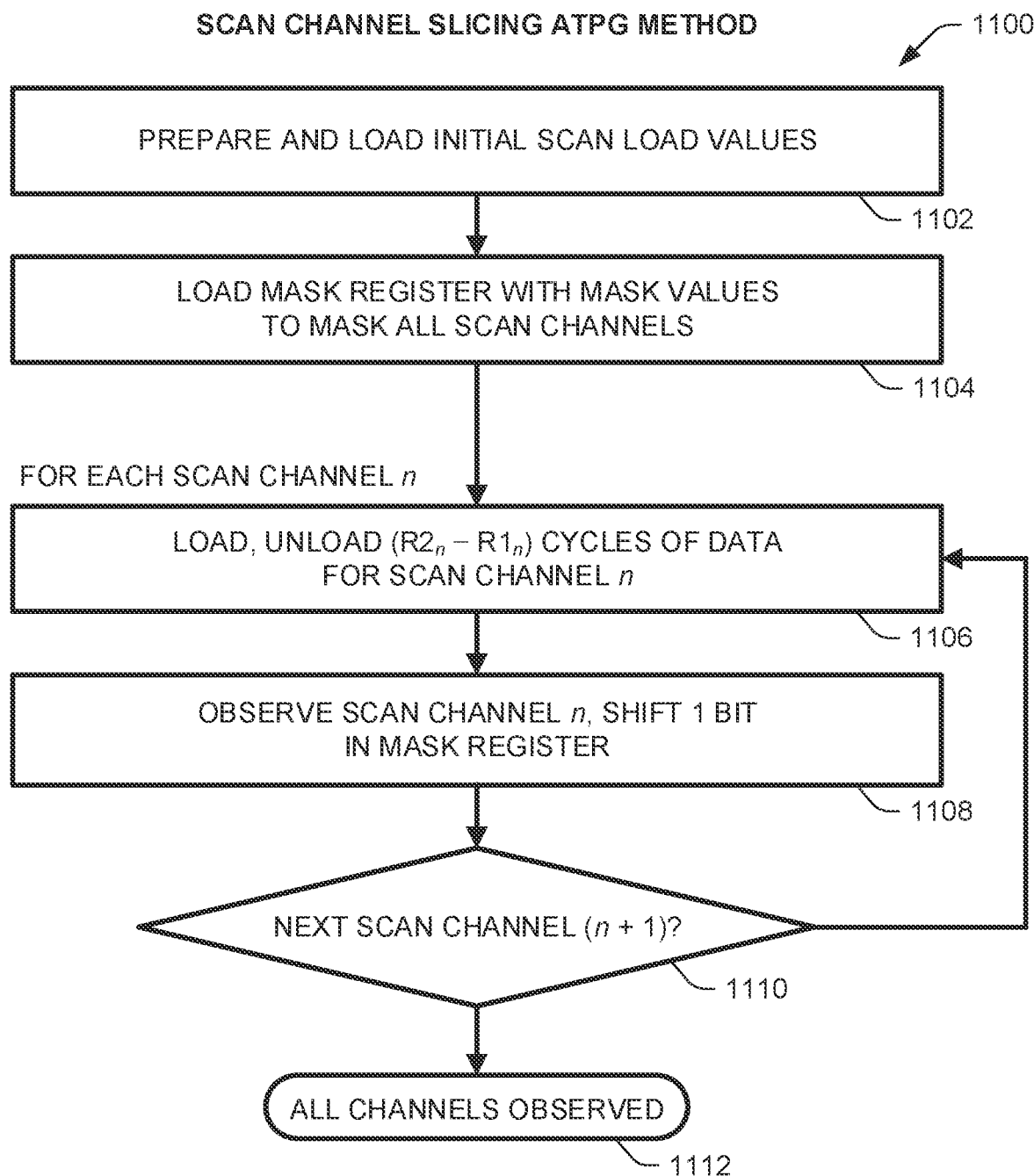
FIG. 11 is a flow chart showing an example scan channel slicing ATPG method.

FIG. 11 is a flow chart illustrating a method 1100 of scan channel slicing. First, scan load values are prepared 1102, corresponding to the Sliced_Init_Scan_Load( ) event of FIG. 8, and including, for example, the method 1000 of FIG. 10. Next, a mask register is loaded 1104 with mask values to mask all channels, corresponding to the Load_Channel_Masks( ) event of FIG. 8. The method 1100 then iterates over each channel, each time shifting 1108 one bit in the mask register, as can be done with the Sliced_Load_Channel_Masks( ) event of FIG. 8. This allows the observation of the corresponding channel, loading and unloading 1106 $R2_n$ minus $R1_n$ bits (corresponding to the difference number of cycles of the end cycle minus the start cycle) into the channel n, to observe the corresponding channel. This loading and unloading can be done, for example, with the Sliced_Scan_Load( ) and Sliced_Scan_Unload( ) events of FIG. 8. This process 1106, 1108 is repeated, each time incrementing 1110 the scan channel number n by 1, until all channels are observed 1112, that is, until each channel has been tested for its corresponding slice cycle.

The listing of FIG. 12 illustrates an example sliced mask pattern as a template encapsulated within a procedure. A primary input stimulus event Stim_PI( ) and a scan chain Pulse( ) event incur L test cycles, where L is equal to the length of the longest scan chain in the test architecture. This provides the initial scan chain load and thus corresponds to the Sliced_Init_Scan_Load( ) event in FIG. 8. A primary input stimulus event Stim_PI( ) and a mask register Pulse( ) event incur M test cycles, where M is equal to the length of the mask register. This provides the initial mask register load and thus corresponds to the Load_Channel_Masks( ) event of FIG. 8. Then, several events are performed within a loop that iterates N times, where N is the number of scan chains (measure registers). Each iteration of the loop corresponds to slice set 804 of FIG. 8. A primary output measurement event Measure_PO( ) a primary input stimulus event Stim_PI( ) and a scan chain Pulse( ) event together incur k test cycles, where k is equal to the slice length $(R2_n - R1_n)$. These events correspond to the Sliced_Scan_Load( ) and Sliced_Scan_Unload( ) events of FIG. 8.

A primary input stimulus event Stim_PI( ) and a mask register Pulse( ) event incur 1 cycle. These events correspond to the Sliced_Load_Channel_Masks( ) event of FIG. 8 and operate to advance the mask register to observe the next channel.

Table 2, below, provides a test cycle expenditure comparison between a simple masking procedure and a scan channel slicing procedure for an example test architecture with N=3,136 scan chains (or 3,136 measure registers) each having a length of L=100, in which the mask register contains M=3,136 bits to independently mask the 3,136 scan chains. The computations in Table 2 are made using the expressions given above in the description of FIGS. 3A-3C and 4A-4C. With a simple masking procedure, like that shown in FIGS. 3A-3C, N=3,136 patterns have to loaded, and in addition, there needs to be one final push of 100 bits to unload the data from the last channel test. This means there will be 313,700 scan cycles consumed with a simple masking procedure. The number of mask cycles is even more significant when the mask register needs to be reloaded for the observation of each scan chain. In the example of Table 2, the mask register length is M=3,136. For each of 3,136 scan chains, the mask register must be reloaded 3,136 times, resulting in a number of mask cycles that grows as the square of the number of scan chains. As can be seen from Table 2, not counting any initialization cycles incurred in the setup of the test, a simple masking procedure consumes more than ten million test cycles for a test architecture of the given size.

By contrast, using a channel slicing test method, like the one shown in FIGS. 4A-4C, the scan cycles include the loading the N=3,136 scan chains with an initial load of L=100 test values, and thereafter, the unloading of the slice length S=4 bits N=3,136 times, for a sum of 12,644 scan cycles. An even greater advantage is provided by the improved operation of the mask register, which is loaded only once, and shifted once, one bit at a time, for each of the other 3,135 channels, for a total number of test cycles (excluding initialization cycles, which are the same for both test procedures) of under 19,000, a more than 500× speed improvement over the simple mask test procedure for an example industrial design of the given test architecture size. In general, the estimated cycle time reduction is in the order of number of scan chains present in the design, about N/S. The greater the number of scan chains, and the longer the scan chains are, the greater is the cycle advantage of channel slicing test methods over simple masking procedures. In practical designs, there may be thousands of scan chains each thousands of bits in length.

TABLE 2

Comparison of test cycle counts with channel slicing vs. without

|  | Simple mask | Sliced mask |
| --- | --- | --- |
| Scan cycles | 3,137 × 100 = 313,700 | 100 + (4 × 3,136) = 12,644 |
| Mask cycles | 3,136 × 3,136 = 9,834,496 | 3,136 + 3,135 = 6,271 |
| Total cycles | 10,148,196 | 18,915 |

The scan channel slicing systems and methods of the present application improve scan chain diagnosis by reducing the cycle count, and thus the tester time, needed to conduct scan chain diagnosis. Because test equipment is billed by the cycle or by tester time, the scan channel slicing systems and methods of the present application substantially reduce test costs. Because the scan channel slicing systems and methods reduce the number of test cycles, the test time on the tester is significantly reduced, as are the charges associated with the tester. Additionally, because the scan channel slicing systems and methods of the present application use lower dynamic power test patterns, substantial electrical power savings can also be realized by testing with the scan channel slicing systems described herein. The systems and methods described herein can leverage existing masking hardware already provided within DFT ICs.

In addition to cycle time reduction, tester cost reduction, and power reduction, the scan channel slicing systems and methods described herein provide the following other benefits. Scan chain tests using the scan channel slicing systems and methods described herein can be included as part of a production ATPG pattern set. Scan chain tests using the scan channel slicing systems and methods described herein avoid the need for multiple passes to debug scan integrity issues. Failures can be directly processed by a diagnosis tool to identify failing chains and also the nature of the defect in each chain (hold/setup/stuck/intermittent/multiple defects etc.). The scan channel slicing systems and methods described herein can be used to extensively verify not just a design's scan chains but also the masking hardware and clock and control circuitry. The scan channel slicing methods described herein can be extended to generate a low-power scan-pattern to mitigate potential current—resistance drop ("IR drop") issues. The scan channel slicing systems and methods described herein are compression-architecture agnostic and hierarchical-test architecture agnostic. As examples, the scan channel slicing systems and methods described herein can work with such compressors/decompressors as XOR-based compressors, sequential compressors (such as multiple input-shift register [MISR], or compact MISR compressors), elastic decompressors, or physically-aware compression architectures such as 2D-elastic compression architectures.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An automated test equipment (ATE) device comprising:
   an interface having input and output ports adapted to be communicatively coupled to an integrated circuit (IC) under test, the IC comprising:
   a decompressor to decompress compressed inputs from the ATE device,
   a plurality of scan chains;
   scan channel selection logic to permit observation of outputs from one of the plurality of scan chains at a time by masking outputs of others of the plurality of scan chains; and
   a compressor to compress outputs from the plurality of scan chains;

a scan channel slicer to apportion, among the plurality of scan chains, respective test patterns for loading into respective ones of the plurality of scan chains, the apportionment such that the observed outputs of each scan chain is for a respective subset of scan cycles of a scan test, each respective subset not overlapping in scan cycles with the respective subsets of any of the other scan chains, the apportionment such that each respective test pattern includes all four bit-to-bit transitions, and the apportionment such that each respective test pattern is shorter than a longest scan chain of the plurality of scan chains; and an automatic test pattern generator to generate compressed test patterns.

2. The device of claim 1, wherein the scan channel slicer includes a model of the decompressor, the model comprising linear equations used by the decompressor.

3. The device of claim 1, wherein the scan channel selection logic comprises a shift register and a number of AND gates equal to the length of the shift register.

4. The device of claim 3, wherein the length of the shift register is equal to the number of the plurality of scan chains in the IC.

5. The device of claim 1, wherein the scan channel slicer and the automatic test pattern generator are provided as machine-readable instructions read from a non-transitory memory and executed by a general-purpose processor.

6. The device of claim 1, wherein the number of the plurality of scan chains is greater than about 5,000.

7. The device of claim 1, wherein the length of the longest of the plurality of scan chains is greater than about 100.

8. A scan channel slicing method for compression-mode testing of scan chains, the method comprising:

preparing initial scan load values and loading the initial scan load values into a plurality of scan chains in an integrated circuit (IC) under test, the plurality of scan chains coupled to a mask register and a compressor;

loading the mask register in the IC to mask all of the scan chains; and independently observing each of the plurality of scan chains for faults by, for each respective scan chain of the plurality of scan chains:

shifting one bit into the mask register to permit isolated observation of the respective scan chain by unmasking only the respective scan chain in the mask register; and unloading to the compressor a number of scan cycles of test data from the respective scan chain, the number of scan cycles being less than a length of a longest of the plurality of scan chains;

wherein the preparing the initial scan load values comprises, for each respective scan chain of the plurality of scan chains:

computing a compressed input stream of values that, when decompressed by a decompressor in the IC, comprises the scan cycles and a number of remainder cycles, the scan cycles including all four bit-to-bit transitions within a scan channel slice for the respective scan chain, and the remainder cycles being outside of the scan channel slice and having fewer than 10 percent "1" to "0" or "0" to "1" bit-to-bit transitions.

9. The method of claim 8, wherein the number of cycles of test data unloaded to the compressor from the respective scan chain is determined from the scan load table computed during the preparing the initial scan load values.

10. The method of claim 8, wherein the preparing the initial scan load values comprises, for each scan chain of the plurality of scan chains:

determining a start cycle of the scan cycles and an end cycle of the scan cycles to the scan channel slice; and storing the start cycle and the end cycle to a scan load table in a row of the scan load table that corresponds to the given one of the plurality of scan chains.

11. The method of claim 10, wherein the start cycle of the scan channel slice for the respective scan chain is determined as either:

a first cycle of a scan load operation, based on the respective scan chain being a first of the plurality of scan chains to be loaded, or otherwise the next cycle after an end cycle of a scan channel slice for a preceding scan chain.

12. The method of claim 11, wherein a start cycle of one of the plurality of scan chains is a number greater than the length of the longest of the plurality of scan chains.

13. The method of claim 11, wherein a start cycle of one of the plurality of scan chains is a number less than the length of the longest of the plurality of scan chains and an end cycle of the one of the plurality of scan chains is a number greater than the length of the longest of the plurality of scan chains.

14. The method of claim 10, wherein remainder cycles of the initial scan load values outside of the scan channel slice have fewer than 5 percent "1" to "0" or "0" to "1" bit-to-bit transitions.

15. The method of claim 10, wherein remainder cycles of the initial scan load values outside of the scan channel slice have fewer than 1 percent "1" to "0" or "0" to "1" bit-to-bit transitions.

16. A method comprising:

for each respective scan channel of a plurality of scan channels in an integrated circuit (IC) under test:

computing a compressed input stream of values that, when decompressed by a decompressor in the IC to provide a decompressed input stream, comprises scan cycles and a number of remainder cycles, the scan cycles including all four bit-to-bit transitions within a scan channel slice for the respective scan channel, the scan channel slice for the respective scan channel being at a respective location within the decompressed input stream that is different than the locations of scan channel slices for all other scan channels of the plurality of scan channels within decompressed input streams corresponding to the other scan channels, and the remainder cycles being outside of the scan channel slice and having fewer than 10 percent "1" to "0" or "0" to "1" bit-to-bit transitions;

determining a start cycle and an end cycle to the scan channel slice; and storing the start cycle and the end cycle in a row of a scan load table that corresponds to the respective scan channel.

17. The method of claim 16, wherein the start cycle of the scan channel slice for the respective scan channel is determined as either:

a first cycle of a scan load operation, based on the respective scan channel being a first of the plurality of scan channels to be loaded, or otherwise the next cycle after an end cycle of a scan channel slice for a preceding scan channel.

18. The method of claim 16, wherein a start cycle of one of the plurality of scan channels is a number greater than the length of the longest of the plurality of scan channels.

19. The method of claim 16, wherein a start cycle of one of the plurality of scan channels is a number less than the length of the longest of the plurality of scan channels and an end cycle of the one of the plurality of scan channels is a number greater than the length of the longest of the plurality of scan channels.

20. The method of claim 16, further comprising independently observing each of the plurality of scan channels for faults by, for each respective scan channel of the plurality of scan channels:
- shifting one bit into a mask register in the IC to permit the isolated observation of the respective scan channel by unmasking only the respective scan channel in the mask register; and
- unloading to a compressor in the IC a number of scan cycles of test data from the respective scan channel, the number of scan cycles being less than a length of a longest of the plurality of scan channels.

\* \* \* \* \*